United States Patent
Hu et al.

(10) Patent No.: US 11,586,364 B2
(45) Date of Patent: Feb. 21, 2023

(54) MEMORY MANAGEMENT METHOD, MEMORY STORAGE DEVICE AND MEMORY CONTROL CIRCUIT UNIT

(71) Applicant: Hefei Core Storage Electronic Limited, Anhui Province (CN)

(72) Inventors: Xin Hu, Anhui Province (CN); Liang Xu, Anhui Province (CN); Xiaoyang Zhang, Anhui Province (CN); Zhi Wang, Anhui Province (CN)

(73) Assignee: Hefei Core Storage Electronic Limited, Anhui (CN)

( * ) Notice: Subject to any disclaimer, the term of this patent is extended or adjusted under 35 U.S.C. 154(b) by 450 days.

(21) Appl. No.: 16/779,675

(22) Filed: Feb. 3, 2020

(65) Prior Publication Data

US 2021/0191635 A1 Jun. 24, 2021

(30) Foreign Application Priority Data

Dec. 18, 2019 (CN) .......................... 201911310733.4

(51) Int. Cl.
*G06F 3/06* (2006.01)
*G06F 11/20* (2006.01)

(52) U.S. Cl.
CPC .......... *G06F 3/0632* (2013.01); *G06F 3/0619* (2013.01); *G06F 3/0659* (2013.01); *G06F 3/0679* (2013.01); *G06F 11/2094* (2013.01); *G06F 2201/82* (2013.01)

(58) Field of Classification Search
CPC .................................................. G06F 11/2094
USPC .......................................................... 714/6.13
See application file for complete search history.

(56) References Cited

U.S. PATENT DOCUMENTS

| | | | | |
|---|---|---|---|---|
| 2014/0136883 | A1* | 5/2014 | Cohen | G11C 16/3422 714/6.11 |
| 2017/0075593 | A1* | 3/2017 | Kim | G06F 3/0653 |
| 2019/0130983 | A1* | 5/2019 | Singidi | G11C 16/3427 |
| 2020/0210303 | A1* | 7/2020 | Ji | G06F 11/1048 |

FOREIGN PATENT DOCUMENTS

| | | |
|---|---|---|
| TW | I373771 | 10/2012 |
| TW | I587304 | 6/2017 |

OTHER PUBLICATIONS

"Office Action of Taiwan Counterpart Application", dated Dec. 29, 2020, p. 1-p. 11.

* cited by examiner

*Primary Examiner* — Yair Leibovich
(74) *Attorney, Agent, or Firm* — JCIPRNET

(57) ABSTRACT

A memory management method is provided according to the invention. The method includes: reading a physical unit and updating a read count of the physical unit; scanning the physical unit if the updated read count is not less than a read count threshold; and adjusting the read count threshold according to the read count and a read error bit. Therefore, a data unit that needs to be scanned can be determined to reduce unnecessary data scanning.

21 Claims, 6 Drawing Sheets

MEMORY MANAGEMENT METHOD, MEMORY STORAGE DEVICE AND MEMORY CONTROL CIRCUIT UNIT

CROSS-REFERENCE TO RELATED APPLICATION

This application claims the priority benefit of China application no. 201911310733.4, filed on Dec. 18, 2019. The entirety of the above-mentioned patent application is hereby incorporated by reference herein and made a part of this specification.

BACKGROUND OF THE INVENTION

1. Field of the Invention

The invention relates to a memory management technology, and in particular to a memory management method, a memory storage device and a memory control circuit unit.

2. Description of Related Art

Digital cameras, mobile phones and MP3 players have developed very rapidly in recent years, and the demands of customers for storage media have also increased rapidly. A rewritable non-volatile memory module (for example, a flash memory) is very suitable for being installed in the above exemplified various portable multimedia devices thanks to the characteristics of non-volatile data, power saving, small volume, no mechanical structure, and the like.

In a memory management technology, when a read count of a host system for the same data unit in a memory storage device exceeds a certain number, instability of data stored in the data unit may be caused, so that the data unit needs to be scanned and inspected to determine whether the data unit needs to be updated. However, if a data unit in a good condition is often scanned, the efficiency of a memory can be affected. Or, if a data unit in a bad condition is not scanned in time, and the data are removed, data loss can be caused. Therefore, it is necessary to accurately determine the data unit needing to be subjected to data scanning needs.

SUMMARY OF THE INVENTION

The invention provides a memory management method, a memory storage device and a memory control circuit unit, which can determine a data unit needing to be subjected to data scanning.

An exemplary embodiment of the invention provides a memory management method, applied to a memory storage device. The memory management method includes: reading a physical unit and updating a read count of the physical unit; scanning the physical unit if the updated read count is not less than a read count threshold; and adjusting the read count threshold according to the read count and a read error bit.

In one exemplary embodiment of the invention, the step of adjusting the read count threshold according to the read count and the read error bit includes: determining a first read error related factor according to a read error bit threshold and a max read error bit of the physical unit.

In one exemplary embodiment of the invention, the step of adjusting the read count threshold according to the read count and the read error bit includes: determining the read count threshold according to a previous read count threshold, a pre-set read count threshold and the first read error related factor.

In one exemplary embodiment of the invention, the memory management method includes: determining the pre-set read count threshold according to an erase count of the physical unit.

In one exemplary embodiment of the invention, the step of reading the physical unit and updating the read count of the physical unit further includes: acquiring the read error bit of the physical unit.

In one exemplary embodiment of the invention, the step of scanning the physical unit if the updated read count is not less than the read count threshold includes: copying data in the physical unit to another physical unit if the read error bit is greater than a read error bit threshold; and recording the updated read count if the read error bit is not greater than the read error bit threshold.

In one exemplary embodiment of the invention, the step of acquiring the read error bit of the physical unit further includes: updating a max read error bit according to the read error bit if the read error bit is greater than the max read error bit.

In one exemplary embodiment of the invention, the method further includes: determining a second read error related factor according to a read error bit threshold and the updated max read error bit of the physical unit; determining an updated read count threshold according to a previous read count threshold, a pre-set read count threshold and the second read error related factor; and scanning the physical unit if the updated read count is not less than the updated read count threshold.

An exemplary embodiment of the invention further provides a memory storage device, including a connection interface unit, a rewritable non-volatile memory module and a memory control circuit unit. The connection interface unit is configured to be coupled to a host system. The memory control circuit unit is coupled to the connection interface unit and the rewritable non-volatile memory module. The memory control circuit unit is configured to read a physical unit and update a read count of the physical unit. The memory control circuit unit is also configured to scan the physical unit when the updated read count is not less than a read count threshold. Furthermore, the memory control circuit unit is also configured to adjust the read count threshold according to the read count and a read error bit.

In one exemplary embodiment of the invention, the operation that the memory control circuit unit adjusts the read count threshold according to the read count and the read error bit includes: determining a first read error related factor according to a read error bit threshold and a max read error bit of the physical unit.

In one exemplary embodiment of the invention, the operation that the memory control circuit unit adjusts the read count threshold according to the read count and the read error bit includes: determining the read count threshold according to a previous read count threshold, a pre-set read count threshold and the first read error related factor.

In one exemplary embodiment of the invention, the memory control circuit unit determines the pre-set read count threshold according to an erase count of the physical unit.

In one exemplary embodiment of the invention, the operation that the memory control circuit unit reads the physical unit and updates the read count of the physical unit includes: acquiring the read error bit of the physical unit.

In one exemplary embodiment of the invention, the operation that the memory control circuit unit scans the physical unit if the updated read count is not less than the read count threshold includes: copying data in the physical unit to another physical unit if the read error bit is greater than a read error bit threshold; and recording the updated read count if the read error bit is not greater than a read error bit threshold.

In one exemplary embodiment of the invention, the operation of acquiring the read error bit of the physical unit includes: updating a max read error bit according to the read error bit if the read error bit is greater than the max read error bit.

In one exemplary embodiment of the invention, the memory control circuit unit is also configured to determine a second read error related factor according to a read error bit threshold and the updated max read error bit of the physical unit. The memory control circuit unit is also configured to determine an updated read count threshold according to a previous read count threshold, a pre-set read count threshold and the second read error related factor. The memory control circuit unit is also configured to scan the physical unit if the updated read count is not less than the updated read count threshold.

Another exemplary embodiment of the invention provides a memory control circuit unit, configured to control a memory storage device including a rewritable non-volatile memory module, and the memory control circuit unit includes a host interface, a memory interface and a memory management circuit. The host interface is configured to be coupled to a host system. The memory interface is configured to be coupled to the rewritable non-volatile memory module. The memory management circuit is coupled to the host interface and the memory interface. The memory control circuit unit is configured to read a physical unit and update a read count of the physical unit. The memory control circuit unit is also configured to scan the physical unit when the updated read count is not less than a read count threshold. Furthermore, the memory control circuit unit is also configured to adjust the read count threshold according to the read count and a read error bit.

In one exemplary embodiment of the invention, the operation that the memory control circuit unit adjusts the read count threshold according to the read count and the read error bit includes: determining a first read error related factor according to a read error bit threshold and a max read error bit of the physical unit.

In one exemplary embodiment of the invention, the operation that the memory control circuit unit adjusts the read count threshold according to the read count and the read error bit includes: determining the read count threshold according to a previous read count threshold, a pre-set read count threshold and the first read error related factor.

In one exemplary embodiment of the invention, the memory control circuit unit determines the pre-set read count threshold according to an erase count of the physical unit.

In one exemplary embodiment of the invention, the operation that the memory control circuit unit reads the physical unit and updates the read count of the physical unit includes: acquiring the read error bit of the physical unit.

In one exemplary embodiment of the invention, the operation that the memory control circuit unit scans the physical unit if the updated read count is not less than the read count threshold includes: copying data in the physical unit to another physical unit if the read error bit is greater than a read error bit threshold; and recording the updated read count if the read error bit is not greater than the read error bit threshold.

In one exemplary embodiment of the invention, the operation of acquiring the read error bit of the physical unit includes: updating a max read error bit according to the read error bit if the read error bit is greater than the max read error bit.

In one exemplary embodiment of the invention, the memory control circuit unit is also configured to determine a second read error related factor according to a read error bit threshold and the updated max read error bit of the physical unit. The memory control circuit unit is also configured to determine an updated read count threshold according to a previous read count threshold, a pre-set read count threshold and the second read error related factor. The memory control circuit unit is also configured to scan the physical unit if the updated read count is not less than the updated read count threshold.

Based on the above, the memory management circuit may determine the related read error factors according to the read error bit threshold and the max read error bit of the physical unit, and then determine the read count threshold according to the previous read count threshold, the pre-set read count threshold and the related read error factors. After the read count threshold is calculated, the memory management circuit determines whether the read count of the physical unit is not less than the read count threshold, and scans the physical unit if the read count is not less than the read count threshold. Therefore, unnecessary data scanning may be effectively reduced, and/or the problem of data loss caused by untimely scanning of the physical unit may be avoided.

To make the features and advantages of the invention clear and easy to understand, the following gives a detailed description of embodiments with reference to accompanying drawings.

DESCRIPTION OF THE EMBODIMENTS

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 1:
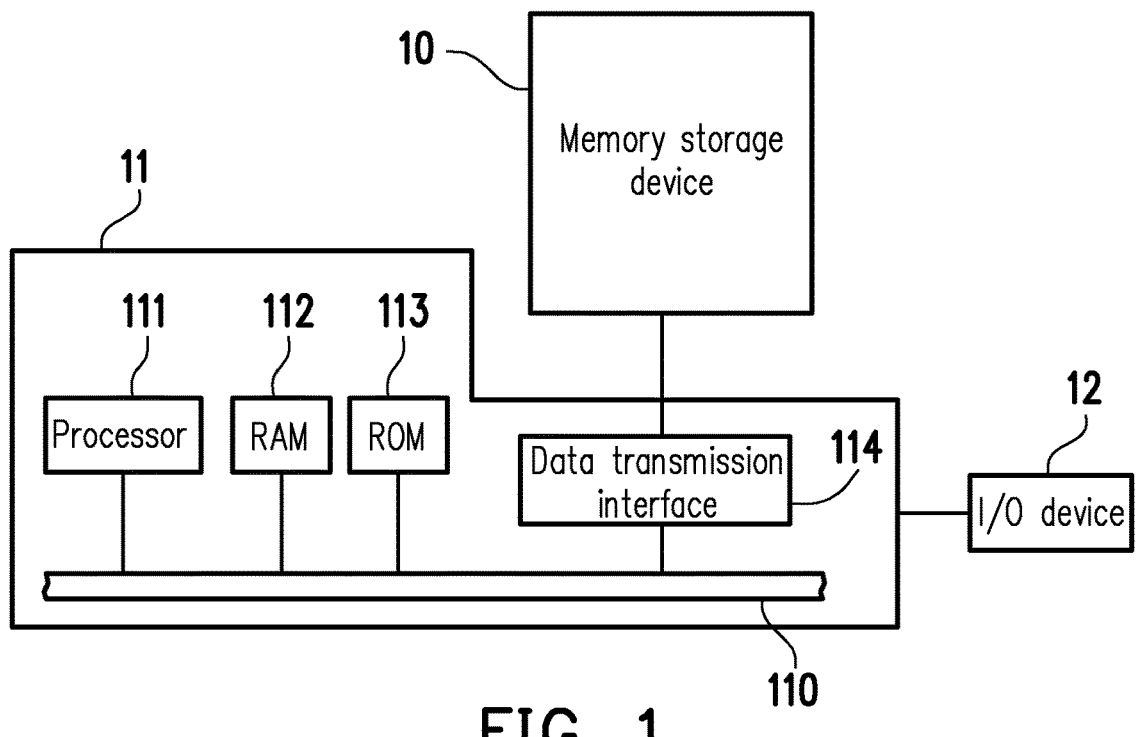
FIG. 1 is a schematic diagram of a host system, a memory storage device and an input/output (I/O) device illustrated according to one exemplary embodiment of the invention.
Figure 2:
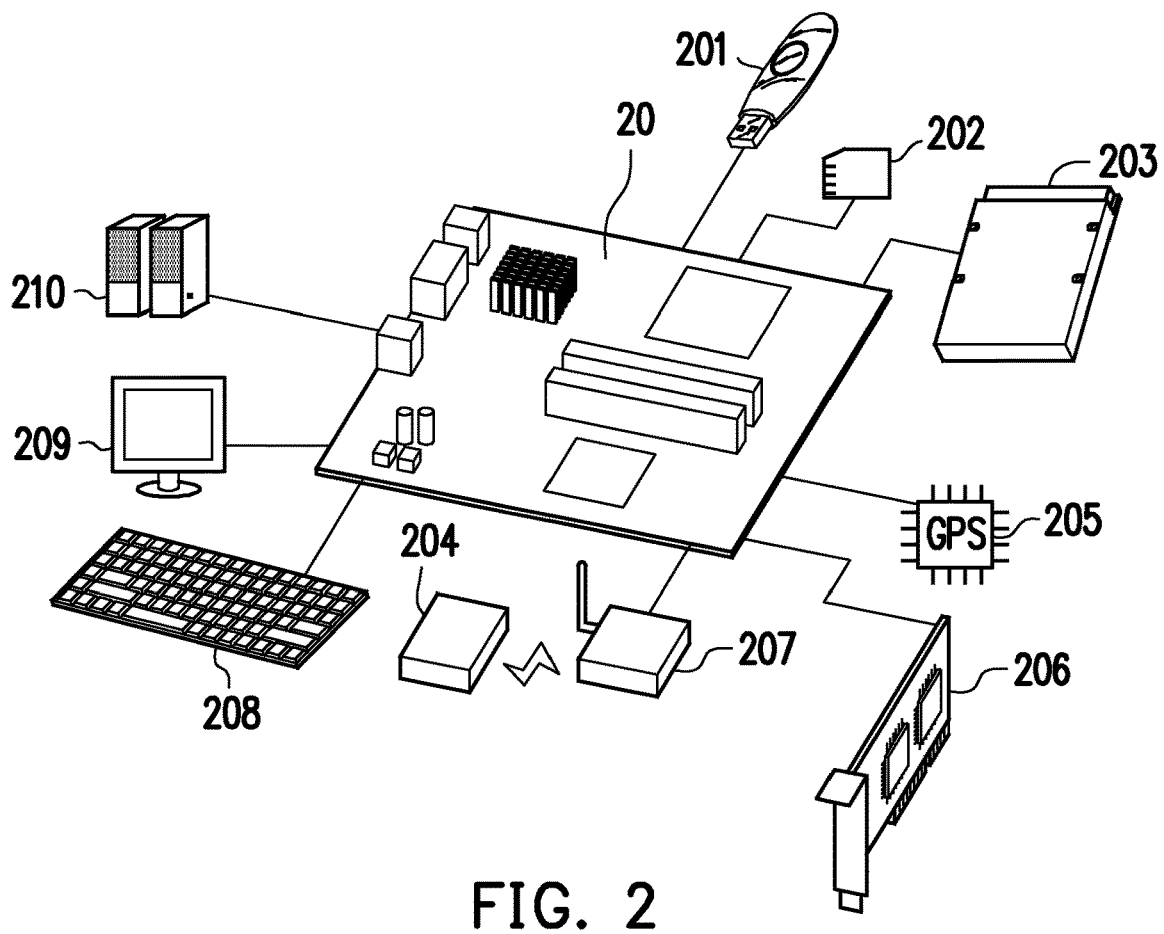
FIG. 2 is a schematic diagram of a host system, a memory storage device and an I/O device illustrated according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In this exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, an SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
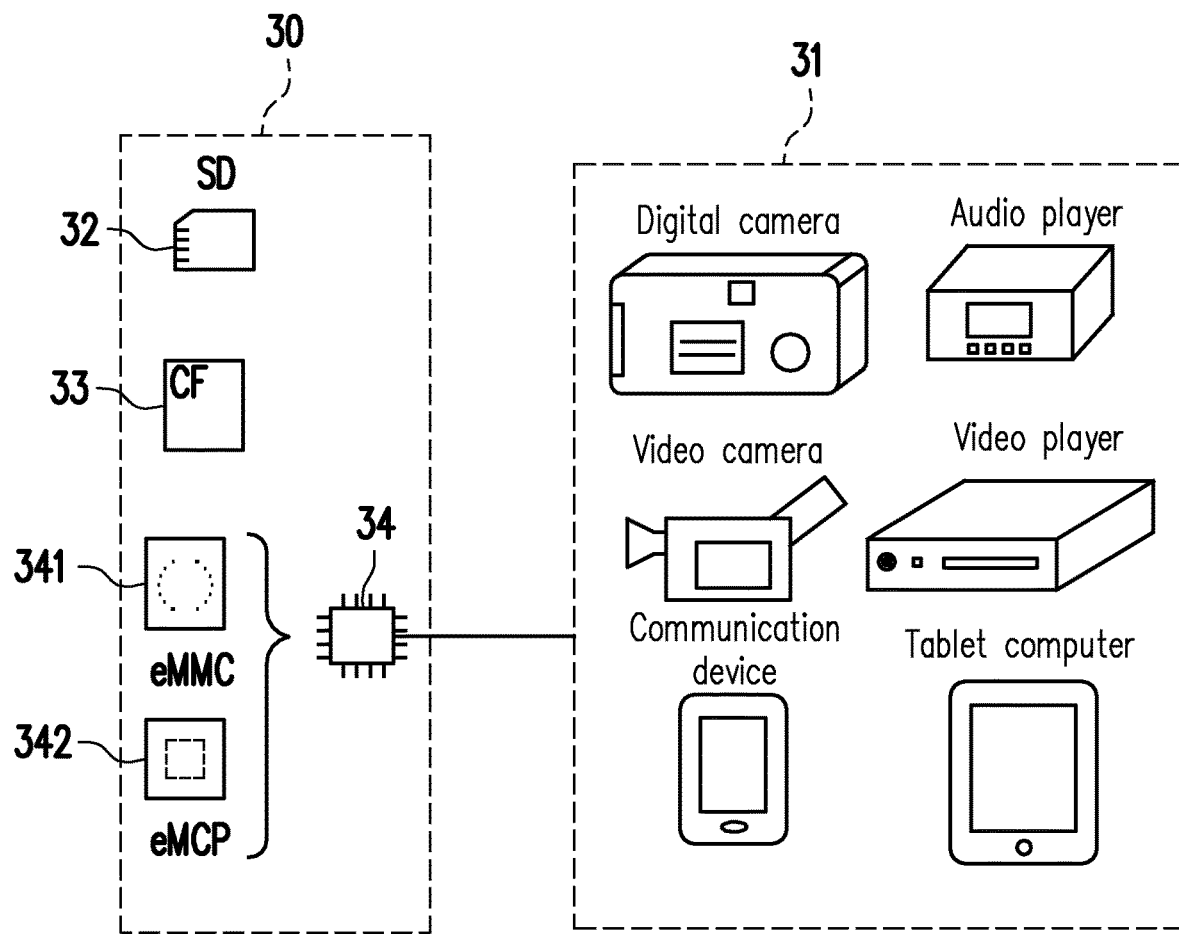
FIG. 3 is a schematic diagram of a host system and a memory storage device illustrated according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
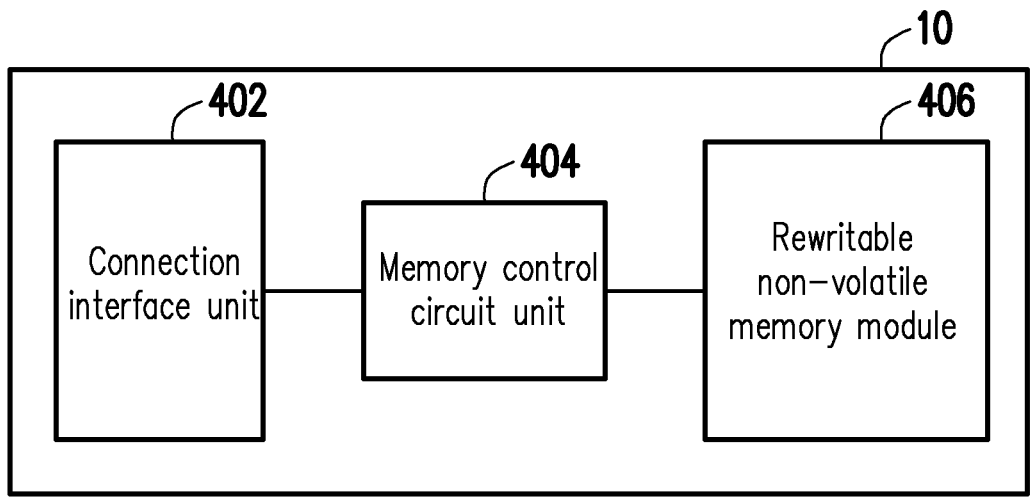
FIG. 4 is a general block diagram of a memory storage device illustrated according to one exemplary embodiment of the invention.

FIG. 4 is a general block diagram of a memory storage device illustrated according to one exemplary embodiment of the invention. Referring to FIG. 4, the memory storage device 10 includes a connection interface unit 402, a memory control circuit unit 404 and a rewritable non-volatile memory module 406.

The connection interface unit 402 is configured to couple the memory storage device 10 to a host system 11. The memory storage device 10 may communicate with the host system 11 through the connection interface unit 402. In the present exemplary embodiment, the connection interface unit 402 is compatible with the serial advanced technology attachment (SATA) standard. However, it must be understood that the invention is not limited to this, and the connection interface unit 402 may also conform to the parallel advanced technology attachment (PATA) standard, the institute of electrical and electronic engineers (IEEE) 1394 standard, the peripheral component interconnect (PCI) express standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard or other suitable standards. The connection interface unit 402 and the memory control circuit unit 404 may be packaged in one chip, or the connection interface unit 402 is disposed outside a chip including the memory control circuit unit 404.

The memory control circuit unit 404 is configured to execute a plurality of logic gates or control commands implemented in a hardware or firmware form, and perform writing, reading and erasing operations and the like on data in the rewritable non-volatile memory module 406 according to a command of the host system 11.

The rewritable non-volatile memory module 406 is coupled to the memory control circuit unit 404 and is configured to store the data written by the host system 11. The rewritable non-volatile memory module 406 may be a single level cell (SLC) NAND-type flash memory module (i.e., a flash memory module with one memory cell that may store one bit), a multi level cell (MLC) NAND-type flash memory module (i.e., a flash memory module with one memory cell that may store two bits), a triple level cell (TLC) NAND-type flash memory module (i.e., a flash memory module with one memory cell that may store three bits), a quad level cell (QLC) NAND-type flash memory module (i.e., a flash memory module with one memory cell that may store four bits), other flash memory modules, or other memory modules with the same characteristic.

Each of the memory cells in the rewritable non-volatile memory module 406 stores one or more bits in response to a change in voltage (hereinafter also referred to as a threshold voltage). Specifically, there is a charge trapping layer between a control gate of each memory cell and a channel. By applying a writing voltage to the control gate, an amount of electrons in the charge trapping layer may be changed, and then the threshold voltage of the memory cell is changed. This operation of changing the threshold voltage of the memory cell is also known as "writing data to the memory cell" or "programming the memory cell". As the threshold voltage changes, each memory cell of the rewritable non-volatile memory module 406 has a plurality of storage states. By applying a reading voltage, a specific storage state of a specific memory cell can be determined, one or more bits stored by the memory cell may be obtained.

In the present exemplary embodiment, the memory cells of the rewritable non-volatile memory module 406 may constitute a plurality of physical programmed units, and these physical programmed units may constitute a plurality of physical erasing units. Specifically, the memory cells on a same word line may constitute one or more physical programmed units. If each memory cell may store two or more bits, the physical programmed units on the same word line may be at least classified into a lower physical programmed unit and an upper physical programmed unit. For example, a least significant bit (LSB) of one memory cell belongs to the lower physical programmed unit, and a most significant bit (MSB) of one memory cell belongs to the upper physical programmed unit. Generally speaking, in the MLC NAND-type flash memory, the writing speed of the lower physical programmed unit can be greater than that of the upper physical programmed unit, and/or reliability of the lower physical programmed unit is higher than that of the upper physical programmed unit.

In the present exemplary embodiment, the physical programmed unit is a programmed smallest unit. That is, the physical programmed unit is the smallest unit that writes data. For example, the physical programmed unit may be a physical page or physical sector. If the physical programmed units are physical pages, they may include a data bit region and a redundancy bit region. The data bit region contains a plurality of physical sectors configured to store user data, and the redundancy bit region is configured to store system data (such as an error correcting code and other management data). In the present exemplary embodiment, the data bit region contains 32 physical sectors, and one physical sector has a size of 512 bytes (B). However, in other exemplary embodiments, the data bit region may also contain 8, 16, or more or fewer physical sectors, and a size of each of the physical sectors may be larger or smaller. On the other hand, the physical erasing units are the smallest units for erasing. That is, each physical erasing unit contains the smallest number of erased memory cells. For example, the physical erasing units are physical blocks.

Figure 5:
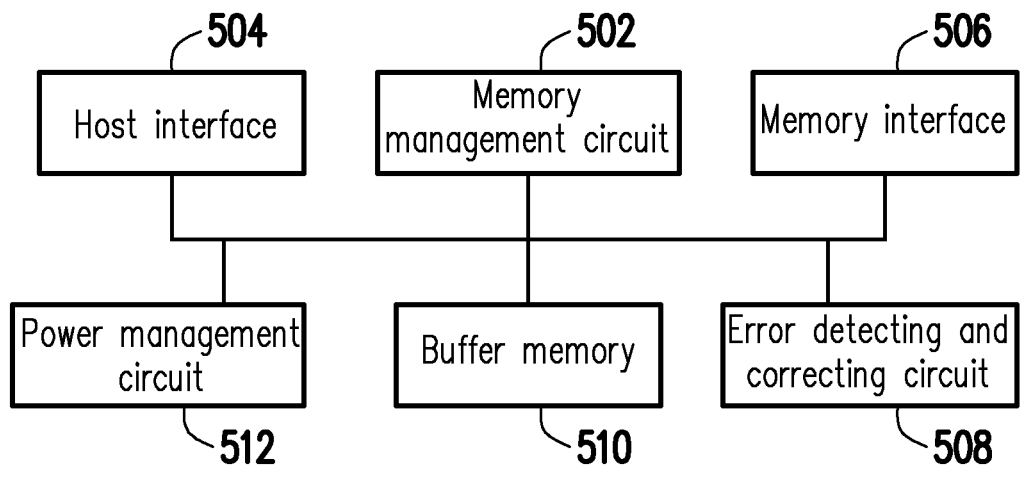
FIG. 5 is a general block diagram of a memory control circuit unit illustrated according to one exemplary embodiment of the invention.

FIG. 5 is a general block diagram of the memory control circuit unit illustrated according to one exemplary embodiment of the invention. Referring to FIG. 5, the memory control circuit unit 404 includes a memory management circuit 502, a host interface 504 and a memory interface 506.

The memory management circuit 502 is configured to control the overall operation of the memory control circuit unit 404. Specifically, the memory management circuit 502 has a plurality of control commands, and when the memory storage device 10 is in operation, these control commands are executed to perform operations such as writing, reading and erasing of the data. The following description of the operation of the memory management circuit 502 is equivalent to the description of the operation of the memory control circuit unit 404.

In the present exemplary embodiment, the control commands of the memory management circuit 502 are implemented in a firmware form. For example, the memory management circuit 502 has a microprocessor unit (not shown) and an ROM (not shown), and these control commands are recorded into the ROM. When the memory storage device 10 is in operation, these control commands may be executed by the microprocessor unit to perform the operations such as writing, reading and erasing of data.

In another exemplary embodiment, the control commands of the memory management circuit 502 may also be stored in a specific region (such as a system region specially configured to store system data in the memory module) of the rewritable non-volatile memory module 406 in a program code form. In addition, the memory management circuit 502 has a microprocessor unit (not shown), an ROM (not shown) and an RAM (not shown). Particularly, the ROM has a boot code, and when the memory control circuit unit 404 is enabled, the microprocessor unit may firstly execute the boot code to load the control commands stored in the rewritable non-volatile memory module 406 into the RAM of the memory management circuit 502. Then, the microprocessor unit may run these control commands to perform the operations such as writing, reading and erasing of the data.

In addition, in another exemplary embodiment, the control commands of the memory management circuit 502 may also be implemented in a hardware form. For example, the memory management circuit 502 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory cell management circuit is configured to manage memory cells or memory cell groups of the rewritable non-volatile memory module 406. The memory writing circuit is configured to send a writing command sequence to the rewritable non-volatile memory module 406 to write data into the rewritable non-volatile memory module 406. The memory reading circuit is configured to send a reading command sequence to the rewritable non-volatile memory module 406 to read data from the rewritable non-volatile memory module 406. The memory erasing circuit is configured to send an erasing command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The writing command sequence, the reading command sequence and the erasing command sequence may each include one or more program codes or command codes and are configured to instruct the rewritable non-volatile memory module 406 to perform the corresponding operations such as writing, reading and erasing. In one exemplary embodiment, the memory management circuit 502 may also send other types of command sequences to the rewritable non-volatile memory module 406 to instruct the rewritable non-volatile memory module 406 to perform corresponding operations.

The host interface 504 is coupled to the memory management circuit 502. The memory management circuit 502 may communicate with the host system 11 through the host interface 504. The host interface 504 may be configured to receive and identify commands and data transmitted by the host system 11. For example, the commands and the data transmitted by the host system 11 may be transmitted to the memory management circuit 502 through the host interface 504. In addition, the memory management circuit 502 may transmit data to the host system 11 via the host interface 504. In the present exemplary embodiment, the host interface 504 is compatible with the SATA standard. However, it must be understood that the present invention is not limited thereto, and the host interface 504 may be also compatible with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 506 is coupled to the memory management circuit 502 and is configured to access the rewritable non-volatile memory module 406. That is, data to be written to the rewritable non-volatile memory module 406 may be converted into a format acceptable to the rewritable non-volatile memory module 406 via the memory interface 506. Specifically, if the memory management circuit 502 is to access the rewritable non-volatile memory module 406, the memory interface 506 may transmit corresponding command sequences. For example, these command sequences may include a writing command sequence that instructs writing of data, a reading command sequence that instructs reading of data, an erasing command sequence that instructs erasing of data and corresponding command sequences that instruct various memory operations (such as changing of a reading voltage level or performing of a garbage collection operation). These command sequences are generated, for example, by the memory management circuit 502 and transmitted to the rewritable non-volatile memory module 406 via the memory interface 506. These command sequences may include one or more signals, or data on a bus. These signals or data may include command codes or program codes. For example, the reading command sequence may include information such as a read identification code and memory address.

In one exemplary embodiment, the memory control circuit unit 404 further includes an error detecting and correcting circuit 508, a buffer memory 510 and a power management circuit 512.

The error detecting and correcting circuit 508 is coupled to the memory management circuit 502 and is configured to perform an error detecting and correcting operation to ensure the correctness of data. Specifically, when the memory management circuit 502 receives a writing command from the host system 11, the error detecting and correcting circuit 508 may generate a corresponding error correcting code (ECC) and/or an error detecting code (EDC) for data corresponding to the writing command, and the memory management circuit 502 may write the data corresponding to the writing command and the corresponding ECC and/or EDC to the rewritable non-volatile memory module 406. Next, when the memory management circuit 502 reads the data from the rewritable non-volatile memory module 406, it may read the ECC and/or the EDC corresponding to the data at the same time, and the error detecting and correcting circuit 508 may perform an error detecting and correcting operation on the read data according to the ECC and/or EDC.

The buffer memory 510 is coupled to the memory management circuit 502 and is configured to temporarily store the data and the commands from the host system 11 or the data from the rewritable non-volatile memory module 406. The power management circuit 512 is coupled to the memory management circuit 502 and is configured to control a power supply of the memory storage device 10.

In one exemplary embodiment, the rewritable non-volatile memory module 406 of FIG. 4 is also known as a flash memory module, and the memory control circuit unit 404 is also known as a flash memory controller configured to control a flash memory module. In one exemplary embodiment, the memory management circuit 502 of FIG. 5 is also known as a flash memory management circuit.

Figure 6:
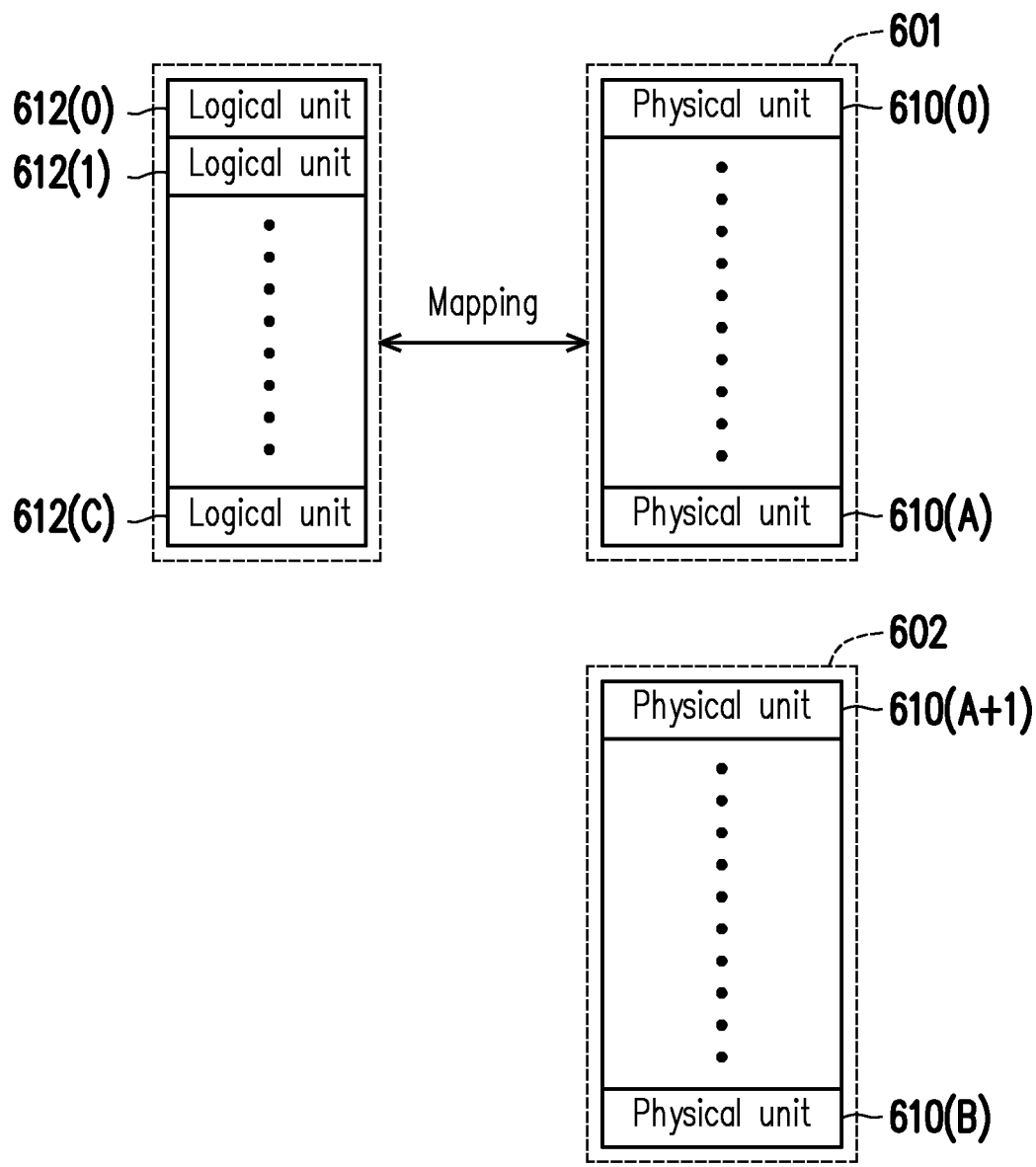
FIG. 6 is a schematic diagram of management of a rewritable non-volatile memory module illustrated according to one exemplary embodiment of the invention.

FIG. 6 is a schematic diagram of management of a rewritable non-volatile memory module illustrated according to one exemplary embodiment of the invention. Referring to FIG. 6, the memory management circuit 502 may logically group physical units 610(0) to 610(B) of the rewritable non-volatile memory module 406 into a storage region 601 and a replacement region 602. The physical units 610(0) to 610(A) in the storage region 601 are configured to store data, and the physical units 610(A+1) to 610(B) in the replacement region 602 are configured to replace damaged physical units in the storage region 601. For example, if data read from a certain physical unit contains too many errors and cannot be corrected, the physical unit may be considered as a damaged physical unit. It should be noted that if there are no available physical erasing units in the replacement region 602, the memory management circuit 502 may possibly declare the entire memory storage device 10 to be in a write protect state, and no data can be written again.

In the present exemplary embodiment, each physical unit refers to a physical erasing unit. However, in another exemplary embodiment, a physical unit may also refer to a physical address or a physical programmed unit, or may consist of a plurality of continuous or non-continuous physical addresses. The memory management circuit 502 may be configured with logical units 612(0) to 612(C) to map the physical units 610(0) to 610(A) in the storage region 601. In the present exemplary embodiment, each logical unit refers to a logical address. However, in another exemplary embodiment, a logical unit may also refer to a logical programmed unit or a logical erasing unit, or may consist of a plurality of continuous or non-continuous logical addresses. In addition, each of the logical units 612(0) to 612(C) may be mapped to one or more physical units.

The memory management circuit 502 may record a mapping relation (also known as a logical-physical address mapping relation) between the logical unit and the physical unit in at least one logical-physical address mapping table. When the host system 11 is to read data from the memory storage device 10 or write data to the memory storage device 10, the memory management circuit 502 may perform a data access operation on the memory storage device 10 according to the logical-physical address mapping table.

In the memory management method provided by the present embodiment, the memory management circuit 502 may separately calculate a read count threshold associated with a read count of each physical unit. In addition, the memory management circuit 502 compares the calculated read count threshold with a read count accumulated by this physical unit to determine whether to scan this physical unit.

In the present embodiment, scanning one physical erasing unit is taken as an example. The memory management circuit 502 may adjust the read count threshold according to the read count and a read error bit of the physical erasing unit. Specifically, the memory management circuit 502 determines a first read error related factor according to a first threshold and a max read error bit of the physical erasing unit. The first threshold (i.e., a read error bit threshold) and the max read error bit are related to the read error bit. For example, the memory management circuit 502 may calculate the first read error related factor according to the following equation (1).

$$factor_{error\ bit} = \frac{threshold_{error\ bit} - error\ bit_{max}}{threshold_{error\ bit}} \quad (1)$$

In the equation (1), the factor$_{error\_bit}$ represents a read error related factor, the threshold$_{error\_bit}$ represents the read error bit threshold, and the error bit$_{max}$ represents the max read error bit. The read error bit threshold is determined in advance through, for example, a series of experiments, and may be configured to determine whether the physical erasing unit needs to be subjected to a refresh operation. Specifically, the refresh operation is to copy the data in the physical erasing unit to another physical unit, then erase the original physical erasing unit and release the physical erasing unit to a physical unit recycling region. The max read error bit is the largest read error bit recorded in the physical erasing unit.

Next, the memory management circuit 502 may determine a fourth threshold (i.e., a read count threshold) according to a second threshold (i.e., a previous read count threshold), a third threshold (i.e., a pre-set read count threshold) and the first read error related factor. The second threshold and the third threshold are related to the read count of the physical unit. For example, the memory management circuit 502 may calculate the read count threshold according to the following equation (2).

$$threshold_{next} = threshold_{pre} + threshold_{normal} \times factor_{error\_bit} \quad (2)$$

In equation (2), threshold$_{next}$ represents a read count threshold, threshold$_{pre}$ represents the previous read count threshold, threshold$_{normal}$ represents the pre-set read count threshold, and the factor$_{error\_bit}$ represents a read error related factor. Specifically, the previous read count threshold is a read count threshold configured to determine whether to perform the scanning when the memory management circuit 502 scans the physical erasing unit at the last time. The pre-set read count threshold is determined, for example, by the memory management circuit 502 according to an erase count of the physical erasing unit. If the erase count is larger, the physical erasing unit may have a risk of reduction of an overall space or damage, so that the erase count is in negative correlation with the pre-set read count threshold. That is, if the erase count of the physical erasing unit is larger, the pre-set read count threshold is smaller. In other words, the read count threshold may be re-calculated and determined according to the erase count of the physical erasing unit. In one exemplary embodiment, a correspondence between each erase count and the pre-set read count threshold may be, for example, stored in a lookup table, and the memory management circuit 502 may input the erase count into this lookup table and consider an output of this lookup table as the pre-set read count threshold corresponding to the erase count. The correspondence between the erase count and the pre-set read count threshold is, for example, as shown in the following table 1. For different memories, the correspondence between the erase count and the pre-set read count threshold may also be different. For an SLC NAND-type flash memory module, the pre-set read count threshold may decrease as the erase count increases. On the other hand, for an MLC NAND-type flash memory module, the pre-set read count threshold may increase and then decrease as the erase count increases.

TABLE 1

|  | Erase count | Pre-set read count threshold |
|---|---|---|
| FULL SLC Erase Count Group | 00-50 | 5.0M |
|  | 51-4000 | 5.0M |
|  | 4001-10000 | 3.2M |//

TABLE 1-continued

|  | Erase count | Pre-set read count threshold |
|---|---|---|
|  | 10001-20000 | 2.5M |
|  | 20001- | 600k |
| FULL TLC Erase Count Group | 0-50 | 1.0M |
|  | 51-150 | 2.5M |
|  | 151-500 | 1.9M |
|  | 501-1000 | 1.4M |
|  | 1001- | 500k |
| Open SLC Erase Count Group | 00-50 | 3.0M |
|  | 51-4000 | 3.0M |
|  | 4001-10000 | 2.1M |
|  | 10001-20000 | 1.6M |
|  | 20001- | 400k |
| Open TLC Erase Count Group | 0-50 | 500k |
|  | 51-150 | 1.4M |
|  | 151-500 | 1.1M |
|  | 501-1000 | 800k |
|  | 1001- | 250k |

In other embodiments, the correspondence between each erase count and the pre-set read count threshold may also be calculated by an equation, and the invention is not limited thereto.

In one exemplary embodiment, the equations (1) and (2) may also be adjusted. For example, other variables are added or at least partial logical operational elements are adjusted to meet practical demands, as long as the calculated read count threshold and the max read error bit of the physical erasing unit are in negative correlation.

When a reading command from the host system 11 is received, the memory management circuit 502 may send a reading command sequence to instruct the rewritable non-volatile memory module 406 to read data from these memory cells. The memory management circuit 502 may read a physical programmed unit (also known as a physical page) according to the reading command, and update the read count of the physical erasing unit. Specifically, when the memory management circuit 502 reads the physical programmed unit at each time, the read count of the physical erasing unit can be constantly accumulated and the read count can be updated. The memory management circuit 502 determines whether the updated read count is not less than the read count threshold, and scans the physical erasing unit if the updated read count is not less than the read count threshold. The memory management circuit 502 continues to receive a reading command from the host system 11 if the updated read count is less than the read count threshold, and continues to accumulate the read count of the physical erasing unit until the read count is greater than or equal to the read count threshold.

By comprehensively considering the influence of the factors such as the erase count and the read error bit on the read count threshold, the memory management method provided by the present embodiment may accurately determine whether to scan the physical erasing unit.

In the memory management method provided by the present embodiment, the memory management circuit 502 may also determine operations performed on the physical erasing unit according to other conditions after scanning the physical erasing unit. Specifically, scanning the physical erasing unit may be, for example, reading all the physical programmed units or partial physical programmed units of the physical erasing unit (such as only reading the physical programmed units on odd pages or even pages, or reading the physical programmed units every a fixed number of pages such as three pages or five pages), and the memory management circuit 502 may obtain the read error bit of each physical programmed unit when reading the physical programmed units of the above-mentioned physical erasing unit. The memory management circuit 502 determines whether the updated read error bit is greater than the first threshold (i.e., the read error bit threshold). The memory management circuit 502 refreshes the above-mentioned physical erasing unit if the memory management circuit 502 determines that the read error bit is greater than the read error bit threshold. In the refresh operation, the memory management circuit 502 copies the data in the physical erasing unit to another physical erasing unit, then erases the above-mentioned physical erasing unit and releases the physical erasing unit to the physical erasing unit recycling region. The memory management circuit 502 records the updated read count if the memory management circuit 502 determines that the read error bit is not greater than the read error bit threshold, and step S803 is performed. The memory management circuit 502 continues to receive a reading command from the host system 11, and updates the read error bit during the reading of the physical erasing unit.

In the memory management method provided by the present embodiment, the memory management circuit 502 may re-calculate a read count threshold according to different conditions. For example, the memory management circuit 502 updates the max read error bit according to the read error bit of the physical unit. Specifically, the memory management circuit 502 may determine whether the read error bit is greater than the max read error bit. The memory management circuit 502 updates the max read error bit according to the read error bit if the memory management circuit 502 determines that the read error bit of the read physical programmed unit is greater than the max read error bit. The memory management circuit 502 continues to receive a reading command from the host system 11, and updates the read error bit during the reading of the physical unit, if the memory management circuit 502 determines that the read error bit of the read physical programmed unit is not greater than the max read error bit.

In the present exemplary embodiment, the memory management circuit 502 re-calculates a read count threshold after updating the max read error bit. Specifically, the memory management circuit 502 may determine a second read error related factor according to the read error bit threshold and the updated max read error bit of the physical unit, then determine a fifth threshold (i.e., an updated read count threshold) according to a previous read count threshold, a pre-set read count threshold and the second read error related factor, and scan the physical unit if the updated read count is not less than the updated read count threshold.

Figure 7:
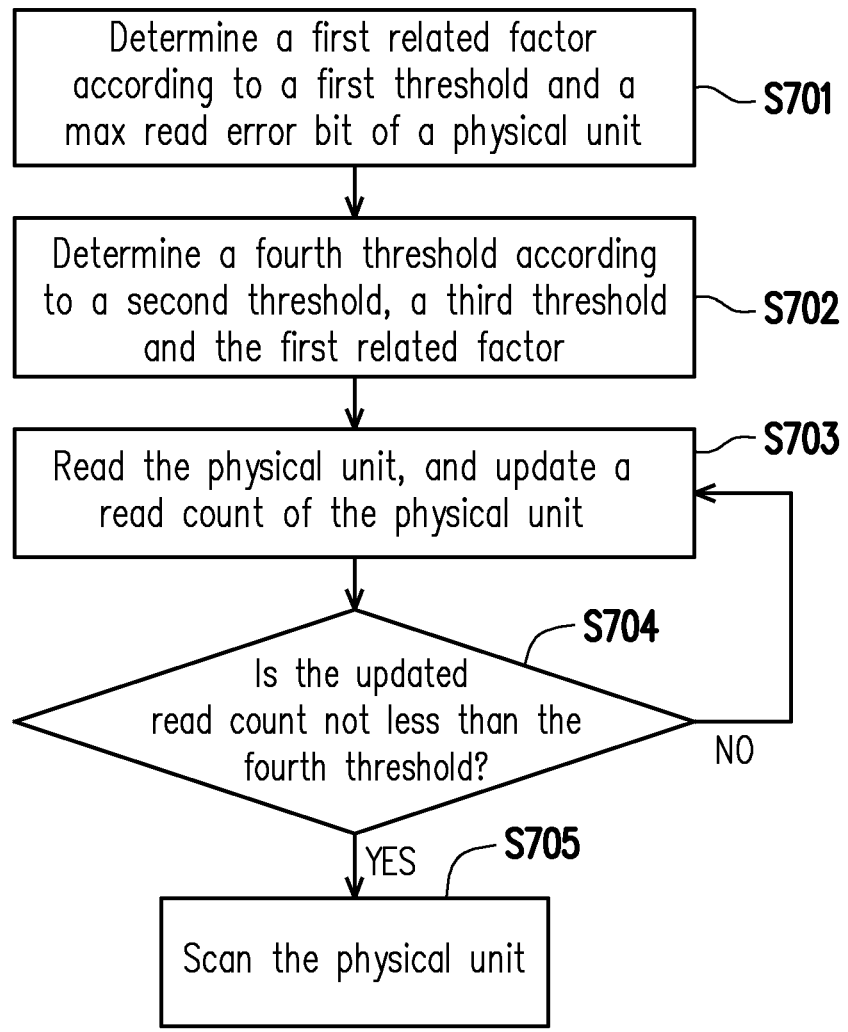
FIG. 7 is a flow diagram of a memory management method illustrated according to one exemplary embodiment of the invention.

FIG. 7 is a flow diagram of a memory management method illustrated according to one exemplary embodiment of the invention. Referring to FIG. 7, in step S701, a first related factor is determined according to a first threshold and a max read error bit of a physical unit. In step S702, a fourth threshold is determined according to a second threshold, a third threshold and the first related factor. In step S703, the physical unit is read according to a reading command, and a read count of the physical unit is updated. In step S704, whether the updated read count is not less than the fourth threshold is determined, and the physical unit is scanned (step S705) if the updated read count is not less than the fourth threshold (the determination result in step S704 is YES). Step S703 may be performed if the updated read count is less than the fourth threshold (the determination result in step S704 is NO).

Figure 8:
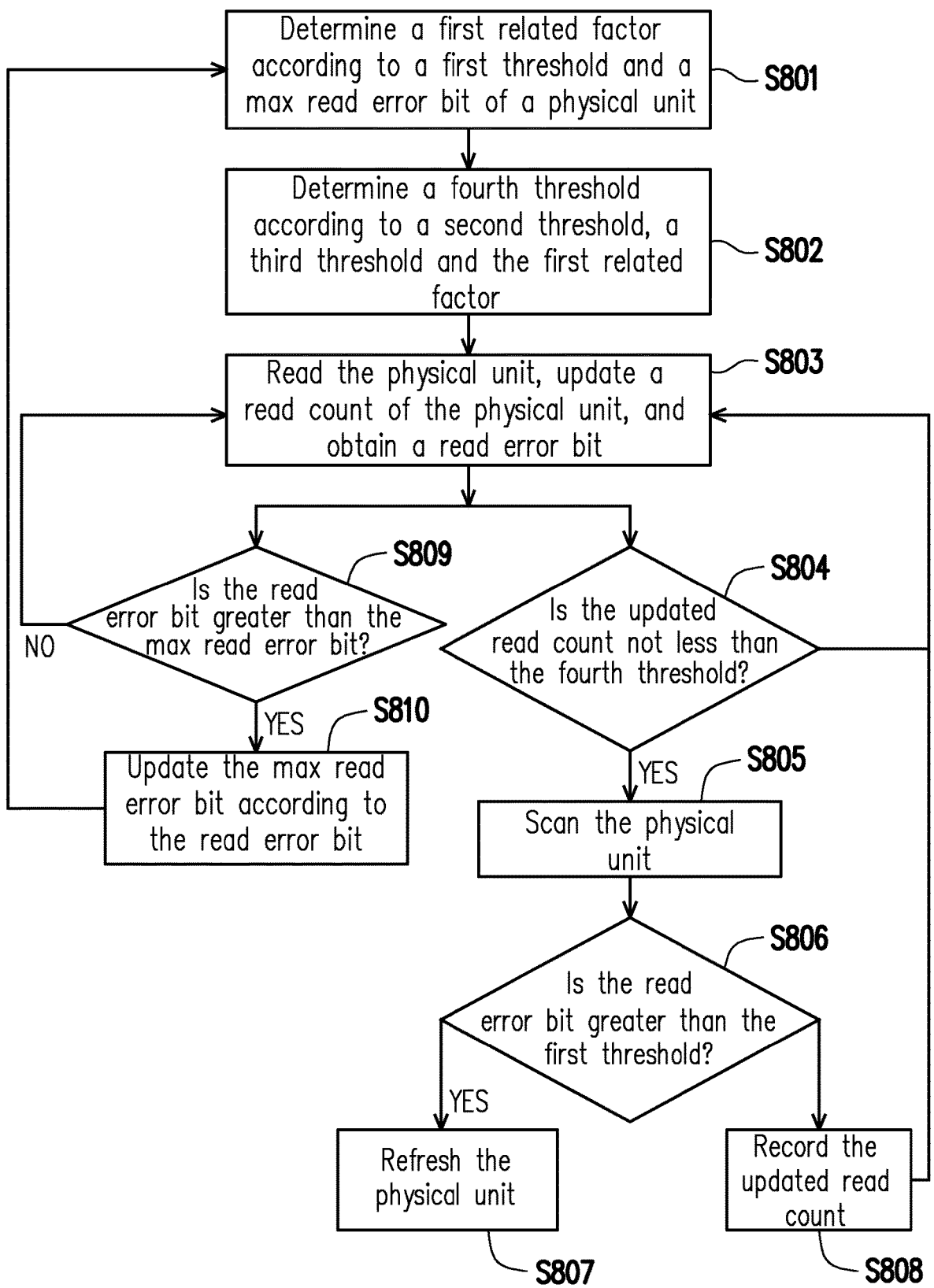
FIG. 8 is a flow diagram of a memory management method illustrated according to one exemplary embodiment of the invention.

FIG. 8 is a flow diagram of a memory management method illustrated according to one exemplary embodiment of the invention. Referring to FIG. 8, for specific contents of steps S801 to S805, reference may be made to the above-mentioned steps S701 to S705. The steps are described above in detail, and descriptions thereof are omitted here. It should be noted that in step S803, during the reading of the physical unit, a read error bit of the physical unit is also obtained in addition to updating the read count of the physical unit. In step S806, whether the updated read error bit is greater than the first threshold (i.e., a read error bit threshold) is determined. The physical unit is refreshed (in step S807) if it is determined that the read error bit is greater than the first threshold (the determination result in step S806 is YES). The updated read count is recorded (in step S808) if it is determined that the read error bit is not greater than the first threshold (the determination result in step S806 is NO), and step S803 may be performed. In step S809, whether the read error bit is greater than a max read error bit is determined. The max read error bit is updated according to the read error bit (in step S810) if it is determined that the read error bit of the physical unit is greater than the max read error bit (the determination result in step S809 is YES). Step S803 may be performed if it is determined that the read error bit of the physical unit is not greater than the max read error bit (the determination result in step S809 is NO).

It should be noted that all the steps in FIG. 7 and FIG. 8 may be implemented as a plurality of program codes or circuits, and the invention is not limited thereto. In addition, in all the above embodiments, the memory management circuit 502 stores, for example, all the thresholds, the read counts, the (max) read error bits, calculation results and other data into specific regions of the rewritable non-volatile memory module 406.

Based on the above, the memory management method, the memory storage device and the memory control circuit unit provided by the invention take comprehensive consideration of the influence of the erase count and the read error bit on the read count threshold, and can dynamically calculate the read count threshold of each physical unit according to the max read error bit of each physical unit, so as to accurately determine whether the physical unit needs to be subjected to data scanning. Therefore, unnecessary data scanning may be effectively reduced, and/or the problem of data loss caused by untimely scanning of the physical unit may be avoided, and the efficiency of a memory is improved.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A memory management method, applied to a memory storage, and comprising:
   reading a physical erasing unit and updating a read count of the physical erasing unit by a memory control circuit;
   scanning the physical erasing unit by the memory control circuit if the updated read count is not less than a read count threshold; and
   dynamically calculating the read count threshold according to the read count and a read error bit by the memory control circuit, wherein a step of dynamically calculating the read count threshold according to the read count and the read error bit by the memory control circuit comprises:
  determining a first read error related factor according to a read error bit threshold and a max read error bit of the physical erasing unit by the memory control circuit.

2. The memory management method according to claim 1, wherein the step of dynamically calculating the read count threshold according to the read count and the read error bit by the memory control circuit comprises:
  determining the read count threshold according to a previous read count threshold, a pre-set read count threshold and the first read error related factor by the memory control circuit.

3. The memory management method according to claim 2, wherein the memory management method comprises:
  determining the pre-set read count threshold according to an erase count of the physical erasing unit by the memory control circuit.

4. The memory management method according to claim 1, wherein a step of reading the physical erasing unit and updating the read count of the physical erasing unit by the memory control circuit further comprises:
  acquiring the read error bit of the physical erasing unit by the memory control circuit.

5. The memory management method according to claim 4, wherein the step of scanning the physical erasing unit by the memory control circuit if the updated read count is not less than the read count threshold comprises:
  copying data in the physical erasing unit to another physical erasing unit by the memory control circuit if the read error bit is greater than a read error bit threshold; and
  recording the updated read count by the memory control circuit if the read error bit is not greater than the read error bit threshold.

6. The memory management method according to claim 4, wherein the step of acquiring the read error bit of the physical erasing unit by the memory control circuit further comprises:
  updating a max read error bit according to the read error bit by the memory control circuit if the read error bit is greater than the max read error bit.

7. The memory management method according to claim 6, wherein the method further comprises:
  determining a second read error related factor according to a read error bit threshold and the updated max read error bit of the physical erasing unit by the memory control circuit;
  determining an updated read count threshold according to a previous read count threshold, a pre-set read count threshold and the second read error related factor by the memory control circuit; and
  scanning the physical erasing unit by the memory control circuit if the updated read count is not less than the updated read count threshold.

8. A memory storage, comprising:
  a connection interface, configured to be coupled to a host system;
  a rewritable non-volatile memory; and
  a memory control circuit, coupled to the connection interface and the rewritable non-volatile memory,
  wherein the memory control circuit is configured to read a physical erasing unit and update a read count of the physical erasing unit;

the memory control circuit is further configured to scan the physical erasing unit when the updated read count is not less than a read count threshold; and
the memory control circuit is further configured to dynamically calculate the read count threshold according to the read count and a read error bit,
wherein an operation that the memory control circuit dynamically calculates the read count threshold according to the read count and the read error bit comprises:
  determining a first read error related factor according to a read error bit threshold and a max read error bit of the physical erasing unit.

9. The memory storage according to claim 8, wherein the operation that the memory control circuit dynamically calculates the read count threshold according to the read count and the read error bit comprises:
  determining the read count threshold according to a previous read count threshold, a pre-set read count threshold and the first read error related factor.

10. The memory storage according to claim 9, wherein the memory control circuit determines the pre-set read count threshold according to an erase count of the physical erasing unit.

11. The memory storage according to claim 8, wherein an operation that the memory control circuit reads the physical erasing unit and updates the read count of the physical erasing unit comprises:
  acquiring the read error bit of the physical erasing unit.

12. The memory storage according to claim 11, wherein an operation that the memory control circuit scans the physical erasing unit if the updated read count is not less than the read count threshold comprises:
  copying data in the physical erasing unit to another physical erasing unit if the read error bit is greater than a read error bit threshold; and
  recording the updated read count if the read error bit is not greater than the read error bit threshold.

13. The memory storage according to claim 11, wherein an operation of acquiring the read error bit of the physical erasing unit comprises:
  updating a max read error bit according to the read error bit if the read error bit is greater than the max read error bit.

14. The memory storage according to claim 13, wherein the memory control circuit is further configured to determine a second read error related factor according to a read error bit threshold and the updated max read error bit of the physical erasing unit;
  the memory control circuit is further configured to determine an updated read count threshold according to a previous read count threshold, a pre-set read count threshold and the second read error related factor;
  the memory control circuit is further configured to scan the physical erasing unit if the updated read count is not less than the updated read count threshold.

15. A memory control circuit, configured to control a memory storage comprising a rewritable non-volatile memory, the memory control circuit comprising:
  a host interface, configured to be coupled to a host system;
  a memory interface, configured to be coupled to the rewritable non-volatile memory; and
  a memory management circuit, coupled to the host interface and the memory interface,
  wherein the memory control circuit is configured to read a physical erasing unit and update a read count of the physical erasing unit;

the memory control circuit is further configured to scan the physical erasing unit when the updated read count is not less than a read count threshold; and the memory control circuit is further configured to dynamically calculate the read count threshold according to the read count and a read error bit, wherein an operation that the memory control circuit dynamically calculates the read count threshold according to the read count and the read error bit comprises:

determining a first read error related factor according to a read error bit threshold and a max read error bit of the physical erasing unit.

16. The memory control circuit according to claim 15, wherein the operation that the memory control circuit dynamically calculates the read count threshold according to the read count and the read error bit comprises:

determining the read count threshold according to a previous read count threshold, a pre-set read count threshold and the first read error related factor.

17. The memory control circuit according to claim 16, wherein the memory control circuit determines the pre-set read count threshold according to an erase count of the physical erasing unit.

18. The memory control circuit according to claim 15, wherein an operation that the memory control circuit reads the physical erasing unit and updates the read count of the physical erasing unit comprises:

acquiring the read error bit of the physical erasing unit.

19. The memory control circuit according to claim 18, wherein an operation that the memory control circuit scans the physical erasing unit if the updated read count is not less than the read count threshold comprises:

copying data in the physical erasing unit to another physical erasing unit if the read error bit is greater than a read error bit threshold; and recording the updated read count if the read error bit is not greater than the read error bit threshold.

20. The memory control circuit according to claim 18, wherein an operation of acquiring the read error bit of the physical erasing unit comprises:

updating a max read error bit according to the read error bit if the read error bit is greater than the max read error bit.

21. The memory control circuit according to claim 20, wherein the memory control circuit is further configured to determine a second read error related factor according to a read error bit threshold and the updated max read error bit of the physical erasing unit;

the memory control circuit is further configured to determine an updated read count threshold according to a previous read count threshold, a pre-set read count threshold and the second read error related factor;

the memory control circuit is further configured to scan the physical erasing unit if the updated read count is not less than the updated read count threshold.

* * * * *